(12) United States Patent
Watanabe

(10) Patent No.: US 6,444,010 B1
(45) Date of Patent: Sep. 3, 2002

(54) PLATINUM GROUP IMPURITY RECOVERY LIQUID AND METHOD FOR RECOVERING PLATINUM GROUP IMPURITY

(75) Inventor: Kaori Watanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 5 days.

(21) Appl. No.: 09/709,288

(22) Filed: Nov. 13, 2000

(30) Foreign Application Priority Data

Nov. 11, 1999 (JP) ............................... 11-321776

(51) Int. Cl.$^7$ .................. C22B 11/00; C23F 1/16; C09K 15/02
(52) U.S. Cl. .................... 75/715; 216/109; 252/79.3
(58) Field of Search .................. 75/715; 216/109; 252/79.3

(56) References Cited

U.S. PATENT DOCUMENTS

| | | | |
|---|---|---|---|
| 3,761,312 A | * | 9/1973 | Entwisle et al. |
| 3,761,313 A | * | 9/1973 | Entwisle et al. |
| 5,141,563 A | * | 8/1992 | Colon et al. .................... 134/2 |
| 5,560,857 A | * | 10/1996 | Sakon et al. .................. 510/175 |

FOREIGN PATENT DOCUMENTS

| | | |
|---|---|---|
| JP | 07-193035 | 7/1995 |
| JP | 2701813 | 10/1997 |

\* cited by examiner

*Primary Examiner*—Roy King
*Assistant Examiner*—Tima McGurthy-Banks
(74) *Attorney, Agent, or Firm*—Sughrue Mion, PLLC

(57) ABSTRACT

A mixed aqueous solution containing HCl with a concentration of 10 to 25% by weight, $H_2O_2$ with a concentration of 2 to 5% by weight, and HF with a concentration of 0.01 to 2% by weight or a mixed aqueous solution containing $H_2SO_4$ with a concentration of 65 to 82% by weight, $H_2O_2$ with a concentration of 4 to 16% by weight, and HF with a concentration of 0.01 to 2% by weight is used as a platinum group impurity recovery liquid. The recovery liquid is dripped onto a silicon substrate surface or a film thereon so as to scan the entire surface of the substrate with the droplets. As a result, the platinum group impurity is dissolved into the recovery liquid, and the platinum group impurity is thus recovered.

20 Claims, 3 Drawing Sheets

NUMBER OF REPETITIONS OF REOVERY OPERATION

NUMBER OF REPETITONS OF RECOVERY OPERATION

PLATINUM GROUP IMPURITY RECOVERY LIQUID AND METHOD FOR RECOVERING PLATINUM GROUP IMPURITY

BACKGROUND OF THE INVENTION

1. Field of the Invention

The present invention relates to a platinum group impurity recovery liquid and a method for recovering a platinum group impurity, which can effectively recover a platinum group impurity among contaminants on a surface of a silicon substrate or in a film thereon.

2. Description of the Related Art

Recently, in the electronic industry, as electronic devices have been miniaturized and the integration density thereof has been increased, it has become significantly important to reduce contamination of such devices resulting from materials and production processes used. Since heavy metal contamination particularly degrades the performance of a semiconductor device remarkably, it must be made every effort to eliminate such contamination. In order to detect such problematic metal contamination, a super sensitive metal impurity analysis technique is required.

In general, as metal impurity analysis techniques, chemical analyses are often used due to their high detectability. An impurity metal on the surface of a substrate is generally recovered using a vapor phase decomposition (VPD) method. More specifically, when a hydrofluoric acid gas, or the like, reacts with an oxide film on the silicon substrate, the oxide film is decomposed, thereby producing a decomposed liquid on the surface of the substrate. A recovery liquid is dripped onto the surface of the substrate, and the droplets are, for example, rolled, so that the decomposed liquid on the surface of the silicon substrate is recovered. Then, the obtained solution in which the impurity metal is dissolved is quantitatively measured using an atomic absorption spectrometry (AAS) analyzer or an inductively coupled plasma-mass spectrometry (ICP-MS) analyzer.

With chemical analyses, which are conventionally used for analyzing a metal impurity on the surface of a silicon substrate or in a thin film thereon, it is difficult to recover a noble metal element having an ionization tendency smaller than that of silicon, particularly, Pt. This is because noble metal elements cannot be sufficiently decomposed by a hydrofluoric acid vapor, and even if the noble metal elements could be decomposed, they are reattached to the surface of the silicon substrate due to their ionization tendencies smaller than that of silicon. As a method for recovering Pt, there exists a technique for performing a recovery operation using aqua regia which can dissolve a noble metal as a recovery liquid (Institute of Electronics, Information and Communication Engineers SDM91-159).

In the VPD method, however, since there is a limit in the amount of a recovery liquid which can be used, the amount of an aqua regia recovery liquid which sufficiently can dissolve Pt cannot be used. Therefore, a high recovery rate cannot be obtained by one time recovery operation. A recovery rate of Pt which can be obtained by one time recovery operation is about 70%, and in order to obtain a recovery rate of 90% or more, the recovery operation needs to be repeated twice or more. Moreover, among the noble metal elements, Pt can be dissolved only in heated aqua regia. Therefore, an aqua regia recovery operation needs to be performed while heating a substrate, or using heated aqua regia. Thus, if aqua regia is dripped onto a slightly overheated substrate, aqua regia violently splashes around the substrate, resulting in poor quantitativeness and safety as an analysis method. Moreover, if only a small portion of aqua regia is evaporated or splashed by heating aqua regia on the substrate, it is difficult to maintain the amount of the recovery liquid, and thus the result of the quantitative analysis is significantly affected. Furthermore, it is necessary to provide a local ventilation so that acidic atmosphere is not inhaled during the operation, and it is required to operate in a clean draft chamber whose environment is much safer than an ordinary environment.

In order to solve these problems, Japanese Patent No. 2701813 discloses a method for analyzing an impurity on a surface of a silicon substrate or in a thin film thereon by using, as a recovery liquid in the VPD method, any one of chlorine water, a mixed liquid of chlorine water and ozone water, and electrolytic ion water in which hydrochloric acid is employed as a supporting salt (Conventional Example 1). In Conventional Example 1, it is possible to perform the VPD process without heating the recovery liquid or the silicon substrate, thereby achieving certain measure of safety in the analysis operation.

Japanese Patent Laid-Open Publication No. Hei.7-193035 discloses a method for recovering an impurity element on a surface of a silicon wafer using a solution composed of hydrofluoric acid, hydrogen peroxide, and water, or a solution composed of hydrofluoric acid, hydrogen peroxide, hydrochloric acid, and water as a recovery liquid for recovering an impurity such as Cu whose ionization tendency is smaller than that of silicon (Conventional Example 2). In Conventional Example 2, a Cu-contaminated wafer is produced by contaminating a surface of a wafer with Cu. As a solution for recovering a contaminant, hydrofluoric acid, hydrogen peroxide, hydrochloric acid, and ultrapure water are mixed so that each of the concentrations of the components of the solution is adjusted to be 5% by weight. Thereafter, the recovery liquid is dripped onto the Cu-contaminated wafer so as to scan the entire surface of the wafer twice in five minutes, and then the recovery liquid is recovered. In this way, it is possible to recover the Cu with a recovery rate of 98%.

The technique of Conventional Example 1, however, has problems as follows. The reaction product in the chemical liquid is decomposed if the recovery liquid is reserved for a long time. This is because the reactivity of the recovery liquid is extremely high, and the recovery liquid is unstable. Moreover, since each of ozone water and electrolytic ion water needs a generation device, it takes a long time to produce the recovery liquid.

In the technique of Conventional Example 2, since hydrogen peroxide in the recovery liquid forms a silicon oxide film, hydrofluoric acid is contained in the recovery liquid for etching the surface of the silicon substrate. More specifically, the formation of the silicon oxide film by hydrogen peroxide in the solution and the etching of the silicon oxide film by hydrofluoric acid in the solution are concurrently proceeded for the surface of the silicon substrate, and an impurity element attached to the surface is dissolved together with the silicon oxide film. By containing hydrochloric acid in the solution, the solubility of an impurity element into the solution is enhanced, thereby inhibiting the impurity from reattaching to the silicon wafer. Although copper (Cu) whose ionization tendency is smaller than that of silicon can be analyzed by using this method, platinum group elements (platinum (Pt), ruthenium (Ru), iridium (Ir), etc.) cannot be dissolved due to the too low HCl concentration. Therefore, it is impossible to effectively dissolve and recover the platinum group impurity elements.

SUMMARY OF THE INVENTION

An object of the present invention is to provide a platinum group impurity recovery liquid and a method for recovering a platinum group impurity, which can recover a platinum group metal contaminant on a surface of a silicon substrate or in a film thereon at a high recovery rate in an easy, safe, and highly accurate manner.

The present invention is related to a platinum group impurity recovery liquid for recovering a platinum group impurity on a silicon substrate surface or in a film thereon. The recovery liquid is a mixed aqueous solution containing HCl with a concentration of 10 to 25% by weight, $H_2O_2$ with a concentration of 2 to 5% by weight, and HF with a concentration of 0.01 to 2% by weight.

According to the present invention, the analysis recovery liquid for a platinum group impurity element comprises a mixed aqueous solution containing HCl, $H_2O_2$, and HF. HCl and $H_2O_2$ are contained so as to produce hypochlorous acid (ClO—). Also, since HCl is contained in the recovery liquid with a concentration of 10% by weight or higher, ClO— is produced in a large amount. Such ClO— produced in a large amount can dissolve a platinum group element. In the case where a natural oxide film or a thermal oxide film is formed on the surface of the silicon substrate or a film thereon to be analyzed, a platinum group element can be dissolved by ClO— while etching the silicon oxide film with HF contained in the recovery liquid. As a result, a contaminant such as Pt can be inhibited from attaching to the surface of the silicon substrate. The platinum group elements refer to six elements, i.e., ruthenium (Ru), rhodium (Rh), palladium (Pd), osmium (Os), iridium (Ir), and platinum (Pt), among elements belonging to the group VIII of the periodic table.

Another platinum group impurity recovery liquid according to the present invention is a mixed aqueous solution containing $H_2SO_4$ with a concentration of 65 to 82% by weight, $H_2O_2$ with a concentration of 4 to 16% by weight, and HF with a concentration of 0.01 to 2% by weight.

According to the present invention, a platinum group is dissolved using $H_2SO_4$ contained in the recovery liquid, and the dissolving of the platinum group can be facilitated by $H_2O_2$. Moreover, by containing a small amount of HF in the recovery liquid, even in the case where an oxide film such as a natural oxide film or a thermal oxide film is formed, a platinum group impurity element can be dissolved by $H_2SO_4$ and $H_2O_2$ while etching the silicon oxide film with HF. Therefore, a contaminant such as Pt can be inhibited from attaching to the surface of the silicon substrate.

A method for recovering a platinum group impurity according to the present invention comprises the steps of: making a droplet of the platinum group impurity recovery liquid according to claim 1 or 2 contact a silicon substrate surface or a film thereon so as to scan the silicon substrate surface with the droplet; dissolving the platinum group impurity into the droplet; and recovering the platinum group impurity.

According to the present invention, since the recovery liquid can dissolve a platinum group impurity element, when the recovery liquid is dripped onto the surface of the silicon substrate or the film thereon and the surface of the silicon substrate or the film thereon is scanned with the droplet of the recovery liquid, a platinum group impurity element attached to the surface of the silicon substrate and/or a platinum group impurity element mixed in the surface of the silicon substrate, and a platinum group impurity element attached to the surface of the film on the silicon substrate and/or a platinum group impurity element which exists in the film can be dissolved into the recovery liquid. Therefore, it is only necessary to scan the surface of the substrate or the surface of the film by using a recovery liquid which is an aqueous solution in which commercially available hydrochloric acid or concentrated sulfuric acid, hydrogen peroxide solution, and hydrofluoric acid are mixed. Since there is no need to heat the recovery liquid or the substrate, the recovery operation is easily performed. In addition, since the recovery liquid is not splashed, a platinum group impurity element can be safely dissolved into the recovery liquid, thereby making it possible to efficiently recover the platinum group impurity.

After decomposing the silicon substrate surface or the film thereon by a hydrofluoric acid vapor, the platinum group impurity recovery liquid may be used. Accordingly, the decomposition rate of the surface of the substrate or that of the film formed on the substrate can be increased.

Another method for recovering a platinum group impurity according to the present invention comprises the steps of: dripping a droplet of the platinum group impurity recovery liquid according to claim 1 or 2 onto a silicon substrate surface or a film thereon; and recovering the recovery liquid after the recovery liquid is left standing for a predetermined period of time, wherein an operation of said dropping and recovering are repeated one or more times.

According to the present invention, the recovery liquid is dripped and left standing for a predetermined period of time, thereby etching the silicon substrate or the film thereon in the depth direction at a constant rate. Therefore, by performing one or more repetitions of the operation of recovering the recovery liquid, impurities of a platinum group element in the depth direction of the substrate or the film thereon are recovered, and the concentration distribution thereof can be obtained. The film on the silicon substrate may be a silicon oxide film formed by thermal oxidation, a silicon oxide film deposited by chemical vapor deposition method, or a natural oxide film.

The nature, principle, and utility of the invention will become more apparent from the following detailed description when read in conjunction with the accompanying drawings in which like parts are designated by like reference numerals or characters.

DETAILED DESCRIPTION OF THE PREFERRED EMBODIMENT

Figure 1:
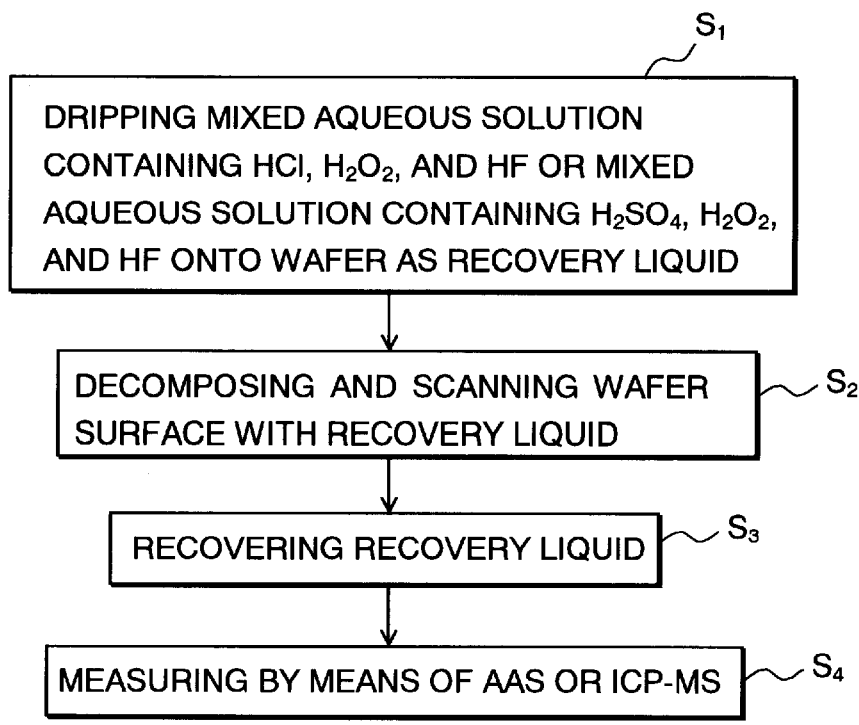
FIG. 1 is a flow chart showing a method for recovering a platinum impurity element according to a first embodiment of the present invention.

A recovery liquid for a platinum group impurity element according to the present invention will be described below in detail. In order to solve the above-described problems, the inventors of the present invention conducted in-depth experimentations and studies. As a result, it is found out that a mixed aqueous solution containing HCl, $H_2O_2$, and HF can effectively recover a platinum group impurity element. More specifically, a platinum group element is dissolved by hypochlorous acid which is produced in the mixed aqueous solution by HCl and $H_2O_2$ contained in the mixed aqueous solution, and a very small amount of HF contained in the mixed aqueous solution can etch an oxide film formed on a surface of a silicon substrate. It is also found out that a mixed aqueous solution containing $H_2SO_4$, $H_2O_2$, and HF can similarly recover a platinum group impurity element. More specifically, the platinum group element is dissolved by an increased content of $H_2SO_4$, and the dissolving of the platinum group element is further facilitated by $H_2O_2$. In addition, an oxide film formed on a surface of a silicon substrate can be etched by a very small amount of HF contained in the mixed aqueous solution.

The inventors also found out that a recovery rate of a platinum group impurity element obtained when such a recovery liquid is used is significantly affected by the concentration of hydrochloric acid or that of sulfuric acid. According to the findings by the inventors, in the case where the mixed aqueous solution containing HCl, $H_2O_2$, and HF is used as a recovery liquid, the concentration of HCl in the recovery liquid needs to be 10 to 25% by weight and the concentration of $H_2O_2$ needs to be 2 to 5% by weight in order to obtain the concentration of hypochlorous acid necessary to dissolve a platinum group element. In the case where the mixed aqueous solution containing $H_2SO_4$, $H_2O_2$, and HF is used as a recovery liquid, the concentration of $H_2SO_4$ in the recovery liquid needs to be 65 to 82% by weight in order to dissolve a platinum group element, and the concentration of $H_2O_2$ needs to be 4 to 16% by weight in order to facilitate the dissolving of the platinum group element by $H_2SO_4$.

When an etching rate needs to be increased, e.g., when a thick oxide film (such as a thermal oxide film) is formed on a surface of a wafer to be analyzed and one wishes to know the amount of contamination by a platinum group impurity element in the film, the concentration of HF in the recovery liquid is about 2% by weight. When the condition of the silicon is close to that of a bare silicon, e.g., when a thin oxide film (such as a natural oxide film) is formed on the surface of the wafer to be analyzed, the concentration of HF in the recovery liquid is as low as 0.01% by weight. A platinum group impurity element can be effectively recovered as follows. While the silicon substrate or the silicon oxide film formed thereon is etched by adjusting an HF concentration in the above-described manner, the platinum group impurity element is dissolved by HCl and $H_2O_2$, or $H_2SO_4$ and $H_2O_2$ contained in the recovery liquid, thereby inhibiting the contaminant such as Pt, which was once dissolved, from reattaching to the surface of the silicon substrate.

Methods for recovering a platinum group impurity element according to embodiments of the present invention will be specifically described below with reference to the accompanying drawings. FIG. 1 is a flow chart showing a method for recovering a platinum group impurity element according to the first embodiment of the present invention. As shown in FIG. 1, in order to analyze contamination by a platinum group impurity element on a surface of a silicon substrate, the platinum group impurity element attached to the surface of the substrate or that contained in the surface of the substrate is recovered. First, as shown in $S_1$, 1 ml, for example, of a mixed aqueous solution containing HCl with a concentration of 10 to 25% by weight, $H_2O_2$ with a concentration of 2 to 5% by weight, and HF with a concentration of 0.01 to 2% by weight, or a mixed aqueous solution containing $H_2SO_4$ with a concentration of 65 to 82% by weight, $H_2O_2$ with a concentration of 4 to 16% by weight, and HF with a concentration of 0.01 to 2% by weight is dripped onto a silicon substrate (wafer), as a recovering liquid.

Thereafter, as shown in $S_2$, the recovery liquid is rolled on the substrate so as to scan the entire surface of the substrate. In this case, although heating of the wafer itself, or the like, is not performed, the temperature of the recovery liquid is slightly raised due to the heat of mixing when the components of the recovery liquid are mixed. After the scanning with the recovery liquid, the recovery liquid is recovered as shown in $S_3$. Thereafter, as shown in $S_4$, quantitative measurement is performed by using an analyzer such as AAS, ICP-MS, or the like.

In the first embodiment of the present invention, the effect of producing hypochlorous acid, with which a platinum group element is likely to react, can be obtained by containing HCl with the high concentration of 10 to 25% by weight and $H_2O_2$ with a concentration of 2 to 5% by weight in the recovery liquid, and the effect of etching a natural oxide film formed on the surface of the substrate can be also obtained by containing HF with a concentration of 0.01 to 2% by weight. Alternatively, when a mixed aqueous solution containing $H_2SO_4$ with a high concentration of 65 to 82% by weight and $H_2O_2$ with a concentration of 4 to 16% by weight is used as another recovery liquid, the effect of dissolving a platinum group impurity element, and the effect of etching a natural oxide film formed on the surface of the substrate by containing HF with a concentration of 0.01 to 2% by weight can be also obtained. The aforementioned two recovery liquids can efficiently recover a platinum group impurity by concurrently proceeding the effect of dissolving a platinum group impurity element and the effect of etching an oxide film, thereby making it possible to analyze the platinum group impurity element with high accuracy.

Moreover, the recovery liquid can be prepared by mixing commercially available chemical liquids. By using the recovery liquid, a platinum group impurity element attached to the surface of a silicon substrate and a platinum group impurity element contained in the surface of the silicon substrate can be easily recovered with high accuracy.

Furthermore, since there is no need to heat a substrate, or the like, there is no risk concerning splashing of the recovery liquid, or the like, thereby making it possible to perform an analysis similar to those used for usual heavy metal (e.g., Fe and Cu) analyses.

As the first variation of the present embodiment, a platinum group impurity element attached to the surface of a substrate and a platinum group impurity element contained in the surface of the substrate can be recovered by performing the decomposition process of the substrate surface by a hydrofluoric acid vapor before dripping a recovery liquid onto the substrate. By decomposing the surface of the substrate using a hydrofluoric acid vapor, the recovery operation can be performed in a short period of time. As the second variation, this method can be applied to an impurity analysis for the reverse side of the wafer.

Figure 3:
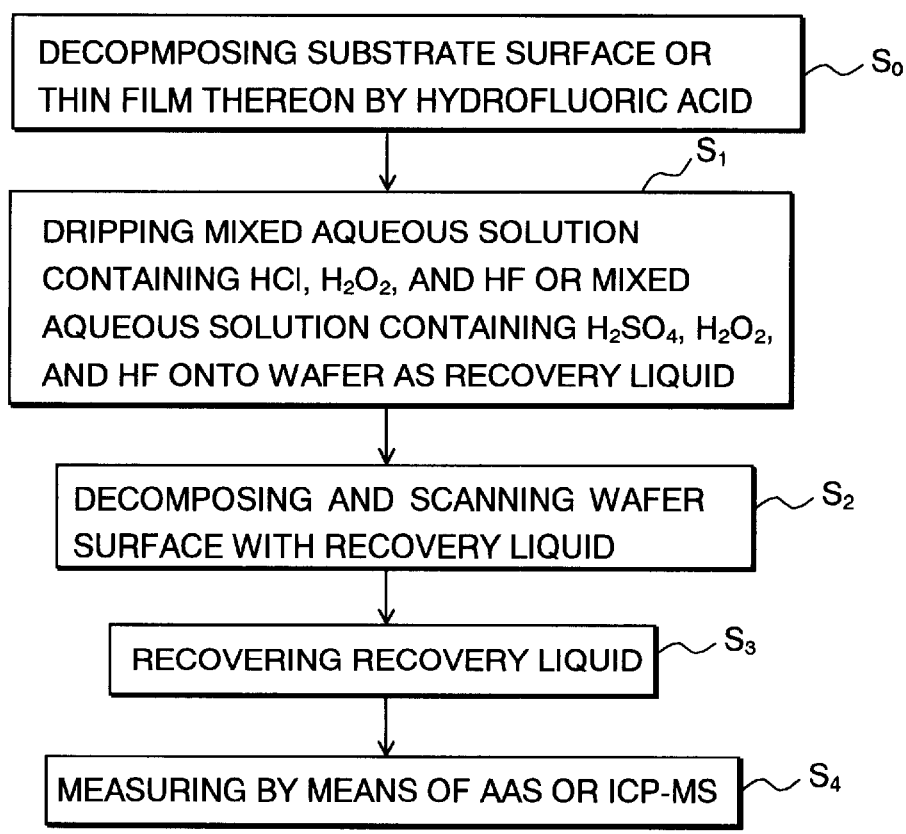
FIG. 3 is a flow chart showing a method for recovering a platinum impurity element according to a second embodiment of the present invention.

Next, the second embodiment of the present invention will be described. While Pt on the surface of the silicon substrate is recovered in the first embodiment, the second embodiment relates to a method for recovering Pt in a thin film formed on a silicon substrate. FIG. 3 is a flow chart showing the method for recovering a platinum impurity in the thin film on the substrate according to the present embodiment.

As shown in FIG. 3, in order to recover and analyze a platinum group impurity element in the thin film on the silicon substrate, first, the entire thin film on the substrate is decomposed by a hydrofluoric acid vapor as shown in $S_0$. Next, as shown in $S_1$, a mixed aqueous solution containing HCl with a concentration of 10 to 25% by weight, $H_2O_2$ with a concentration of 2 to 5% by weight, and HF with a concentration of 0.01 to 2% by weight, or a mixed aqueous solution containing $H_2SO_4$ with a concentration of 65 to 82% by weight, $H_2O_2$ with a concentration of 4 to 16% by weight, and HF with a concentration of 0.01 to 2% by weight is used as a recovery liquid. 1 ml, for example, of the recovery liquid is dripped onto the silicon substrate (wafer). Thereafter, as shown in $S_2$, the recovery liquid is rolled on the substrate so as to scan the entire surface of the substrate. Although the temperature of the recovery liquid is slightly raised due to the heat of mixing when the components of the recovery liquid are mixed, the substrate, or the like, is not heated when scanning the substrate. Next, after scanning the entire surface of the substrate, the recovery liquid is recovered as shown in $S_3$. Thereafter, as shown in $S_4$, quantitative measurement is performed by using an analyzer such as AAS, ICP-MS, or the like.

According to the second embodiment, by decomposing the thin film using a hydrofluoric acid vapor before the recovery operation, it is possible to perform the quantitative analysis of a platinum group impurity element which exists on the surface of a film or in a film which can be decomposed by a hydrofluoric acid vapor, e.g., a silicon oxide film, a thin silicon nitride film with a thickness of about 50 nm or less, and ferroelectric film such as PZT (Pb(Zr,Ti)O$_3$) and BST ((Ba,Sr)TiO$_3$).

Since the thin film can be decomposed very rapidly by a hydrofluoric acid vapor, quantitative analysis can be performed very precisely without causing evaporation of the recovery liquid, absorption of ambient vapor by the recovery liquid, or the like, during the analysis process.

The third embodiment of the present invention will now be described. The present embodiment relates to a method for obtaining a concentration distribution of a platinum group impurity in the depth direction of a silicon substrate or a thin film thereon.

A mixed aqueous solution containing HCl with a concentration of 10 to 25% by weight, $H_2O_2$ with a concentration of 2 to 5% by weight, and HF with a concentration of 0.01 to 2% by weight, or a mixed aqueous solution containing $H_2SO_4$ with a concentration of 65 to 82% by weight, $H_2O_2$ with a concentration of 4 to 16% by weight, and HF with a concentration of 0.01 to 2% by weight is used as a recovery liquid. First, the recovery liquid is dripped onto the silicon substrate or the thin film thereon. After the recovery liquid is left standing for a predetermined period of time, the recovery liquid is recovered and then analyzed. By this operation, the silicon substrate or the thin film thereon is etched by the recovery liquid, and a platinum group impurity contained in the etched portion can be recovered together with the recovery liquid. Therefore, by repeating this operation with the period of time, during which the recovery liquid is left standing, being constant, the concentration of a platinum group impurity element in the depth direction of the silicon substrate or the thin film thereon can be measured.

In the third embodiment, the use of the recovery liquid of the present invention makes it possible to find out the contamination amount by a platinum group impurity element whose ionization tendency is smaller than that of silicon, which is attached to the surface of the silicon substrate or the thin film thereon, i.e., a concentration distribution in the depth direction. Accordingly, since the amount of contamination by a platinum group element which is produced in semiconductor manufacturing processes can be known, it is possible to take measures promptly to reduce contamination in the production line. Therefore, the characteristics of the device can be improved, and the transfer of a contaminant such as platinum from a contaminated device to another product can be reduced. Thus, the mutually potentiating effects of a cost reduction and an increase in yield due to the reduced contamination are obtained by making it possible to manufacture a device in which a platinum group element is used and another kind of device on the same line.

Next, the result of comparison between recovery rates of Pt which were obtained by actually recovering platinum using the recovery liquid and the recovering method of the present invention and those obtained in the conventional example.

EXAMPLE 1

Figure 2:
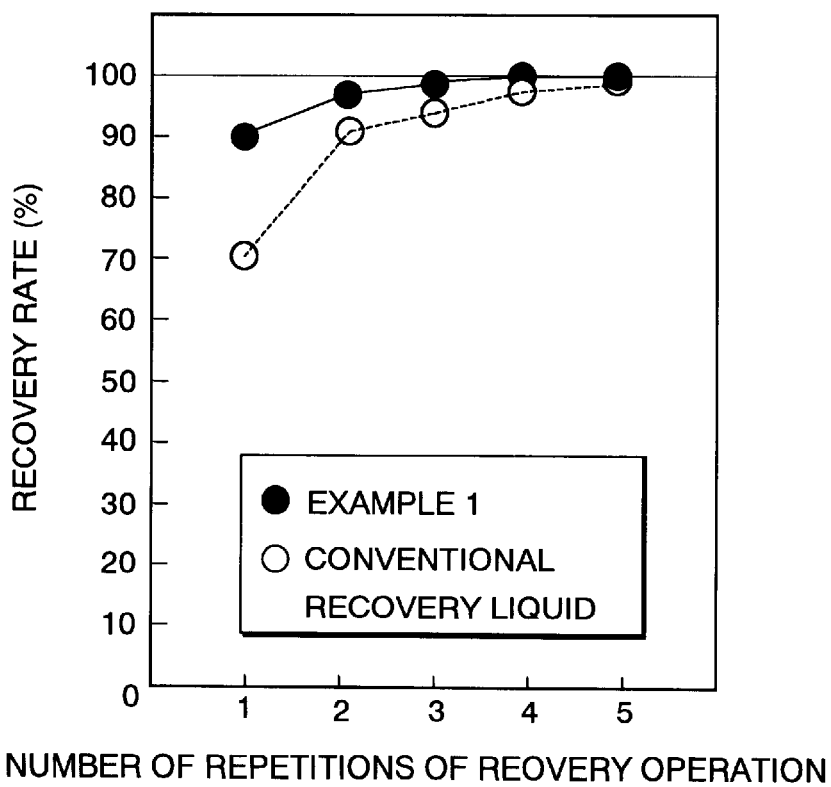
FIG. 2 is a graph showing recovery rates of Pt when Pt on a surface of a silicon substrate is recovered and analyzed.

Pt on a surface of a silicon substrate was recovered using the method for recovering a platinum group impurity element of the first embodiment. FIG. 2 is a graph showing recovery rates of Pt when Pt on the surface of the silicon substrate was recovered and analyzed. FIG. 2 also shows recovery rates of Pt when conventional aqua regia (HNO$_3$:HCl=1:3) was used as a recovery liquid as a comparison to those of Example 1.

In order to evaluate Example 1, a wafer in which the surface of the silicon substrate was intentionally contaminated with Pt at $1\times10^{13}$ atoms/cm$^2$ was used. As a recovery liquid, hydrochloric acid with the concentration of 36% by weight, hydrogen peroxide solution with the concentration of 30% by weight, and hydrofluoric acid with the concentration of 50% by weight, which are commercially available chemical liquids for use in the electronic industry, were used to make a mixed aqueous solution containing HCl with the concentration of 12% by weight, $H_2O_2$ with the concentration of 3% by weight, and HF with the concentration of 0.01% by weight. 1 ml of the recovery liquid was dripped onto the Pt-contaminated substrate, and the recovery liquid was rolled on the substrate so as to scan the entire surface of the substrate. The temperature of the recovery liquid was raised to about 45° when the components of the recovery liquid were mixed. Therefore, the actual temperature of the recovery liquid during the process was in a range of a room temperature to 45°. Herein, heating of the wafer itself, or the like, was not performed at all. After scanning the substrate with the recovery liquid, the recovery liquid was recovered and quantitatively measured by the ICP-MS. Consequently, as shown in FIG. 2, the recovery rate of Pt obtained by one time recovery operation was 70% in the conventional recovery liquid which employed aqua regia, whereas the recovery rate of Pt obtained by one time recovery operation was 90% or more when the recovery liquid of Example 1 was used.

EXAMPLE 2

Figure 4:
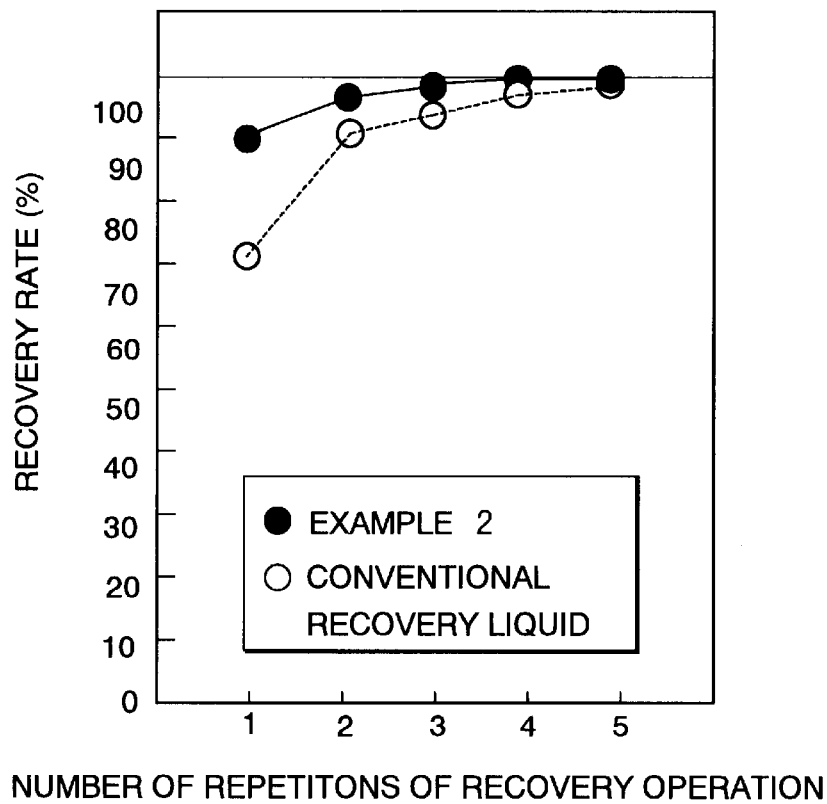
FIG. 4 is a graph showing recovery rates of Pt when platinum in an oxide film on a silicon substrate is recovered and analyzed.

Pt in a thin film on a substrate was recovered by using the method for recovering a platinum group impurity element of the second embodiment. FIG. 4 is a graph showing recovery rates of platinum when platinum was recovered and analyzed by following the flow chart of FIG. 3. FIG. 4 also shows recovery rates when conventional aqua regia was used as a comparison to those of Example 2.

In order to evaluate Example 2, a thermal oxide film with a thickness of 100 nm which was intentionally contaminated with Pt at $1\times10^{13}$ atoms/cm$^2$ was formed on the surface of the silicon substrate. First, using this silicon substrate, the entire thermal oxide film with a thickness of 100 nm was decomposed by a hydrofluoric acid vapor. Next, as a recovery liquid, sulfuric acid with the concentration of 98% by weight, hydrogen peroxide solution with the concentration of 30% by weight, and hydrofluoric acid with the concentration of 50% by weight, which are commercially available chemical liquids for use in the electronic industry, were used to make a mixed aqueous solution containing $H_2SO_4$ with the concentration of 82% by weight, $H_2O_2$ with the concentration of 16% by weight, and HF with the concentration of 0.01% by weight. 1 ml of the recovery liquid was dripped onto the substrate, and the recovery liquid was rolled on the substrate so as to scan the entire surface of the substrate. The temperature of the recovery liquid was raised to 90 when the components of the recovery liquid were mixed. Therefore, the actual temperature of the recovery liquid during the process was in a range of a room temperature to 90° C. Herein, heating of the wafer itself, or the like, was not performed. After scanning the substrate with the recovery liquid, the recovery liquid was recovered and quantitatively measured by the ICP-MS. Consequently, as shown in FIG. 4, the recovery rate of Pt obtained by one time recovery operation was 70% in the conventional recovery liquid which employed aqua regia, whereas the recovery rate of Pt obtained by one time recovery operation was 90% or more when the recovery liquid of Example 2 was used.

EXAMPLE 3

Figure 5:
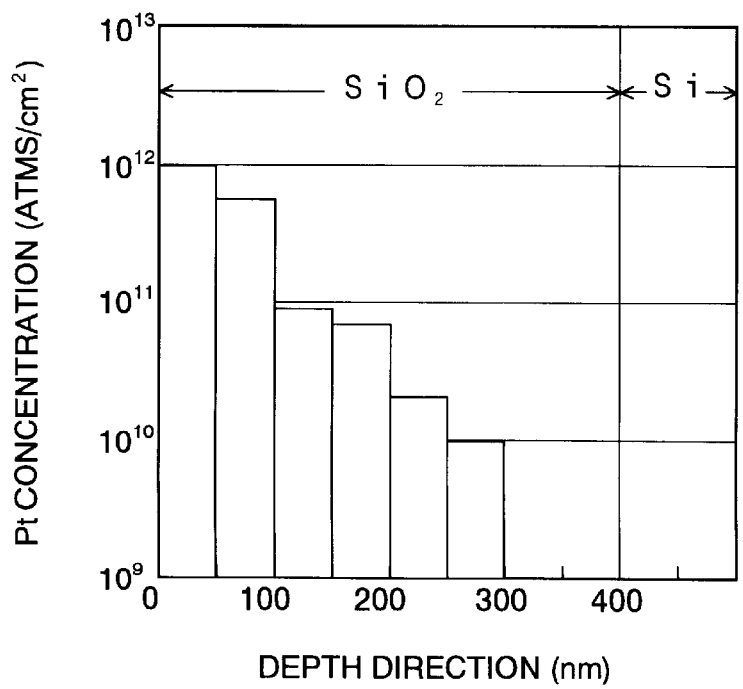
FIG. 5 is a graph showing measurement results of Pt impurity concentrations in the depth direction of a thin film on a silicon substrate.

Pt in a thin film formed on a silicon substrate was recovered by using the method for recovering a platinum group impurity of the third embodiment. FIG. 5 is a graph showing the measurement results of Pt impurity concentrations in the depth direction of the thin film on the silicon substrate.

First, a silicon oxide film with a thickness of 400 nm, which was intentionally contaminated with Pt at $1\times10^{13}$ atoms/cm$^2$, was formed on the silicon substrate by using CVD (Chemical Vapor Deposition) method. As a recovery liquid, a mixed aqueous solution containing HCl with the concentration of 12% by weight, $H_2O_2$ with the concentration of 3% by weight, and HF with the concentration of 1% by weight was produced by using commercially available chemical liquids for use in the electronic industry. 8 ml of the recovery liquid was dripped onto the wafer in which the Pt-contaminated silicon oxide film was formed, and the recovery liquid was left standing for about one minute. The temperature of the recovery liquid was raised to 45° when the components of the recovery liquid were mixed. Therefore, the actual temperature of the recovery liquid during the process was in a range of a room temperature to 45°. Heating of the wafer itself, or the like, was not performed at all. After the recovery liquid was left standing for about one minute, the recovery liquid was recovered and quantitatively measured by the ICP-MS. Such a series of operations were repeated six times. By performing the series of operations once, the silicon oxide film was etched at a rate of 50 nm/minute. As a result, a concentration distribution of a Pt element in the depth direction of a Pt impurity in the silicon oxide film was obtained as shown in FIG. 5.

Accordingly, in any of the examples described above, a platinum group impurity element is dissolved by hypochlorous acid produced by HCl and $H_2O_2$ or a high concentration of $H_2SO_4$, and an oxide film formed on a substrate, or the like, is etched by HF contained in a very small amount. Therefore, a platinum group impurity element on the surface of the silicon substrate or in the film thereon can be easily and safely recovered at a high recovery rate by using commercially available chemical liquids.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A platinum group impurity recovery liquid for recovering a platinum group impurity on a silicon substrate surface or in a film thereon, the recovery liquid being a mixed aqueous solution containing HCl with a concentration of 10 to 25% by weight, $H_2O_2$ with a concentration of 2 to 5% by weight, and HF with a concentration of 0.01 to 2% by weight.

2. A platinum group impurity recovery liquid for recovering a platinum group impurity on a silicon substrate surface or in a film thereon, the recovery liquid being a mixed aqueous solution containing $H_2SO_4$ with a concentration of 65 to 82% by weight, $H_2O_2$ with a concentration of 4 to 16% by weight, and HF with a concentration of 0.01 to 2% by weight.

3. A method for recovering a platinum group impurity for recovering a platinum group impurity on a silicon substrate surface or in a film thereon, comprising the steps of:
    making a droplet of the platinum group impurity recovery liquid being a mixed aqueous solution containing HCl with a concentration of 10 to 25% by weight, $H_2O_2$ with a concentration of 2 to 5% by weight, and HF with a concentration of 0.01 to 2% by weight contact a silicon substrate surface or a film thereon so as to scan the silicon substrate surface with the droplet of the recovery liquid;
    dissolving the platinum group impurity into the droplet; and
    recovering the platinum group impurity.

4. The method for recovering a platinum group impurity according to claim 3, wherein after decomposing the silicon substrate surface or the film thereon by a hydrofluoric acid vapor, the platinum group impurity recovery liquid is used.

5. The method for recovering a platinum group impurity according to claim 3, wherein the film on the silicon substrate is a silicon oxide film formed by thermal oxidation.

6. The method for recovering a platinum group impurity according to claim 3, wherein the film on the silicon substrate is a silicon oxide film deposited by chemical vapor deposition method.

7. The method for recovering a platinum group impurity according to claim 3, wherein the film on the silicon substrate is a natural oxide film.

8. A method for recovering a platinum group impurity for recovering a platinum group impurity on a silicon substrate surface or in a film thereon, comprising the steps of:
    making a droplet of the platinum group impurity recovery liquid being a mixed aqueous solution containing $H_2SO_4$ with a concentration of 65 to 82% by weight, $H_2O_2$ with a concentration of 4 to 16% by weight, and HF with a concentration of 0.01 to 2% by weight contact a silicon substrate surface or a film thereon so as to scan the silicon substrate surface with the droplets of the recovery liquid;
    dissolving the platinum group impurity into the droplet; and recovering the platinum group impurity.

9. The method for recovering a platinum group impurity according to claim 8, wherein after decomposing the silicon substrate surface or the film thereon by a hydrofluoric acid vapor, the platinum group impurity recovery liquid is used.

10. The method for recovering a platinum group impurity according to claim 8, wherein the film on the silicon substrate is a silicon oxide film formed by thermal oxidation.

11. The method for recovering a platinum group impurity according to claim 8, wherein the film on the silicon substrate is a silicon oxide film deposited by chemical vapor deposition method.

12. The method for recovering a platinum group impurity according to claim 8, wherein the film on the silicon substrate is a natural oxide film.

13. A method for recovering a platinum group impurity for recovering a platinum group impurity on a silicon substrate surface or in a film thereon, comprising the steps of:

dripping a droplet of the platinum group impurity recovery liquid being a mixed aqueous solution containing HCl with a concentration of 10 to 25% by weight, $H_2O_2$ with a concentration of 2 to 5% by weight, and HF with a concentration of 0.01 to 2% by weight onto a silicon substrate surface or a film thereon; and recovering the recovery liquid after the recovery liquid is left standing for a predetermined period of time, wherein an operation of said dropping and recovering is repeated one or more times.

14. The method for recovering a platinum group impurity according to claim 13, wherein the film on the silicon substrate is a silicon oxide film formed by thermal oxidation.

15. The method for recovering a platinum group impurity according to claim 13, wherein the film on the silicon substrate is a natural oxide film.

16. A method for recovering a platinum group impurity for recovering a platinum group impurity on a silicon substrate surface or in a film thereon, comprising the steps of:

dripping a droplet of the platinum group impurity recovery liquid being a mixed aqueous solution containing $H_2SO_4$ with a concentration of 65 to 82% by weight, $H_2O_2$ with a concentration of 4 to 16% by weight, and HF with a concentration of 0.01 to 2% by weight onto a silicon substrate surface or a film thereon; and recovering the recovery liquid after the recovery liquid is left standing for a predetermined period of time, wherein an operation of said dripping and recovering is repeated one or more times.

17. The method for recovering a platinum group impurity according to claim 16, wherein the film on the silicon substrate is a silicon oxide film formed by thermal oxidation.

18. The method for recovering a platinum group impurity according to claim 16, wherein the film on the silicon substrate is a natural oxide film.

19. The method for recovering a platinum group impurity according to claim 13, wherein the film on the silicon substrate is a silicon oxide film deposited by chemical vapor deposition method.

20. The method for recovering a platinum group impurity according to claim 16, wherein the film on the silicon substrate is a silicon oxide film deposited by chemical vapor deposition method.

* * * * *